United States Patent
Ikoma

(10) Patent No.: US 7,973,687 B2
(45) Date of Patent: Jul. 5, 2011

(54) DIFFERENTIAL SWITCH, D/A CONVERTER, SEMICONDUCTOR INTEGRATED CIRCUIT AND COMMUNICATION APPARATUS

(75) Inventor: Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/530,877

(22) PCT Filed: Feb. 12, 2009

(86) PCT No.: PCT/JP2009/000558
§ 371 (c)(1),
(2), (4) Date: Sep. 11, 2009

(87) PCT Pub. No.: WO2010/041353
PCT Pub. Date: Apr. 15, 2010

(65) Prior Publication Data
US 2011/0012769 A1 Jan. 20, 2011

(30) Foreign Application Priority Data
Oct. 6, 2008 (JP) ................................. 2008-259567

(51) Int. Cl.
*H03M 1/00* (2006.01)
(52) U.S. Cl. ........................................ 341/136; 341/144
(58) Field of Classification Search .................. 341/144, 341/145, 150, 136; 327/103, 108, 359, 408; 326/121
See application file for complete search history.

(56) References Cited

U.S. PATENT DOCUMENTS

| | | | |
|---|---|---|---|
| 4,951,236 A * | 8/1990 | Kawate et al. ................. | 702/98 |
| 5,406,135 A | 4/1995 | Kasai et al. | |
| 6,842,132 B2 | 1/2005 | Schafferer | |
| 7,034,733 B2 | 4/2006 | Dedic et al. | |
| 2003/0043062 A1 | 3/2003 | Dedic et al. | |
| 2004/0104832 A1* | 6/2004 | Bugeja ......................... | 341/145 |
| 2004/0145506 A1 | 7/2004 | Schafferer | |
| 2007/0091701 A1 | 4/2007 | Sakai | |

FOREIGN PATENT DOCUMENTS

| | | |
|---|---|---|
| JP | 2003-069429 | 3/2003 |
| WO | WO 2004/068716 A1 | 8/2004 |

OTHER PUBLICATIONS

S. Park et al., "Digital-to-Analog Converter Based on Differential-Quad Switching," IEEE Journal of Solid-State Circuits, vol. 37, No. 10, 2002, pp. 1335-1338.
Douglas Mercer, "A Study of Error Sources in Current Steering Digital-to-Analog Converters," IEEE 2004 Custom Integrated Circuits Conference pp. 185-190.

* cited by examiner

*Primary Examiner* — Joseph Lauture
(74) *Attorney, Agent, or Firm* — McDermott Will & Emery LLP

(57) ABSTRACT

A differential switch circuit includes a first differential switch basic circuit (1) and a second differential switch basic circuit (2). The first differential switch basic circuit (1) has a first common source node (N1) shared by a plurality of transistors (TP121 and TP122), and the second differential switch basic circuit (2) has a second common source node (N2) shared by a plurality of transistors (TP131 and TP132). The first common source node (N1) and the second common source node (N2) are alternately reset to a predetermined voltage in each clock cycle.

7 Claims, 9 Drawing Sheets

FIG. 3

|  | DS1 | DS2 | DS3 | DS4 |
|---|---|---|---|---|
| STATE 1 | L | H | H | H |
| STATE 2 | H | L | H | H |
| STATE 3 | H | H | L | H |
| STATE 4 | H | H | H | L |

FIG. 6

|  | DS1 | DS5 | DS2 | DS3 | DS6 | DS4 |
|---|---|---|---|---|---|---|
| STATE 1 | L | H | H | H | L | H |
| STATE 2 | H | H | L | H | L | H |
| STATE 3 | H | L | H | L | H | H |
| STATE 4 | H | L | H | H | H | L |

US 7,973,687 B2

DIFFERENTIAL SWITCH, D/A CONVERTER, SEMICONDUCTOR INTEGRATED CIRCUIT AND COMMUNICATION APPARATUS

RELATED APPLICATIONS

This application is the U.S. National Phase under 35 U.S.C. §371 of International Application No. PCT/JP2009/000558, filed on Feb. 12, 2009, which in turn claims the benefit of Japanese Application No. 2008-259567, filed on Oct. 6, 2008, the disclosures of which Applications are incorporated by reference herein.

TECHNICAL FIELD

The present disclosure relates to differential switches for switching current channels, D/A converters (DAC) for converting digital signals into analog signals, semiconductor integrated circuits, and communication apparatuses. More particularly, the present disclosure relates to techniques for improving distortion characteristics in D/A converters.

BACKGROUND ART

In recent years, various wired or wireless communication systems have been researched and developed. Accordingly, D/A converters for higher speed communications having conversion rates of several hundreds MHz to several tens GHz have become essential. Since D/A converters for communications are particularly desired to have low distortion characteristics, various circuit techniques have been suggested. Current steering D/A converters capable of performing high speed operations are typically used as D/A converters for communications.

FIG. 1 illustrates the overall structure of a conventional current steering D/A converter. In the D/A converter 100, outputs of a plurality of current sources 104-1 through 104-m are respectively coupled to inputs of differential switch circuits 105-1 through 105-m to form a current switch circuit. Output terminals of two of the differential switch circuits 105-1 through 105-m are commonly coupled to a non-inverting output terminal DAOUT and an inverting output terminal NDAOUT of the D/A converter 100. The output terminals DAOUT and NDAOUT are coupled to load resistors 106-1 and 106-2, respectively.

A current of each current source 104-1 through 104-m is set to a value weighted by a bias voltage $V_{bias}$ generated by a bias circuit 101, and combinations of the values represent n bits, i.e., $2^n$ steps.

Furthermore, n-bit digital data $D_0$-$D_{n-1}$, which are input to the D/A converter 100, are converted into digital signals $S_1$-$S_m$ by a decoder circuit 102. Switch driver circuits 103-1 through 103-m synchronize the digital signals $S_1$-$S_m$ with a system clock CLK and input the signals to the differential switch circuits 105-1 through 105-m.

In this circuit structure, the differential switch circuits 105-1 through 105-m allow currents from the current sources 104-1 through 104-m to flow to the non-inverting output terminal DAOUT or to the inverting output terminal NDAOUT, depending on the digital signals $S_1$-$S_m$. The currents are summed at the terminal and then converted into differential analog output voltages at the load resistors 106-1 and 106-2.

Note that a differential output structure is typically used for a D/A converter for communications to reduce even harmonic distortion and common mode noise.

FIG. 8 illustrates a circuit structure of a conventional current switch. FIG. 8 is a circuit diagram of a current switch including a current source 104-1 and a differential switch 105-1. The current source 104-1 includes two P-channel transistors TP201 and TP202. Bias voltages $V_{bias11}$ and $V_{bias12}$ are applied to gates of the transistors TP201 and TP202, respectively. The differential switch circuit 105-1 includes two P-channel transistors TP211 and TP212 of which source terminals are coupled to each other. Complementary digital signals DS and NDS are input to gate terminals of the transistors.

However, where the current switch of FIG. 8 is used for the D/A converter of FIG. 1, the signals DS and NDS are inverted or not inverted, depending on an input digital code. This causes noise dependent on the input digital code, and affects an analog output voltage to degrade distortion characteristics.

To solve the problems mentioned above, a current switch shown in FIG. 9 was suggested. FIG. 9 illustrates a differential switch, in which a constant digital noise is generated in each digital code so that the digital code does not depend on an input digital code. In the current switch of FIG. 9, source terminals of P-channel transistors TP221, TP222, TP231 and TP232 are commonly coupled to an output of a current source 104-1. Drain terminals of the transistors TP221 and TP231 are commonly coupled to a non-inverting output terminal DAOUT, and drain terminals of the transistors TP222 and TP232 are commonly coupled to an inverting output terminal NDAOUT. Gate terminals of the transistors TP221, TP222, TP231 and TP232 are controlled by digital signals DS1, DS2, DS3, and DS4, respectively.

FIG. 3 is a logic table illustrating operation of the current switch shown in FIG. 9. In actual operation, the switch alternates between one of states 1 and 2, and one of states 3 and 4 in each clock cycle. That is, only one of the four switch transistors TP221, TP222, TP231 and TP232 is ON at any time. In all cycles, two of the transistors are alternately change the states, one from ON to OFF and the other from OFF to ON so that a constant digital noise is obtained in each cycle. As such, a constant digital noise can be generated at each digital code which does not depend on an input digital code. The effect of noise on an analog output voltage does not degrade distortion characteristics, since the noise is synchronized with a clock frequency (see, for example, Non-Patent Document 1).

[Patent Document 1] U.S. Pat. No. 7,034,733
[Patent Document 2] U.S. Pat. No. 6,842,132
[Non-Patent Document 1]
S. Park et al., "A Digital-to-Analog Converter Based on Differential-Quad Switching," IEEE Journal of Solid-State Circuits, vol. 37, No. 10, October 2002.
[Non-Patent Document 2]
Douglas Mercer, "A Study of Error Sources in Current Steering Digital-to-Analog Converters," IEEE 2004 Custom Integrated Circuits Conference.

DISCLOSURE OF INVENTION

Problems that the Invention is to Solve

When the current switch of FIG. 9 is used for the D/A converter of FIG. 1, analog output voltages are generated at the analog output terminals DAOUT and NDAOUT. Since drain conductance (gds) of the transistors TP221, TP222, TP231 and TP232 is not 0, the analog output voltages leak to a common source terminal of the differential switch circuit, i.e., a common source terminal of the transistors TP221, TP222, TP231 and TP232. As a result, a slight voltage fluctuation occurs. This degrades constant current characteristics of an output current of the current switch to degrade distortion characteristics (see, for example, Non-Patent Document 2).

The present inventors have focused on these problems. One object of the present invention is to suppress fluctuations in voltage at a common source node of a differential switch circuit, and to improve distortion characteristics of a D/A converter by using the differential switch circuit.

Means of Solving the Problems

To achieve the object, a first aspect of the present invention provides a differential switch circuit including a first differential switch basic circuit and a second differential switch basic circuit coupled in parallel. The first differential switch basic circuit has a first common source node shared by a plurality of transistors, and the second differential switch basic circuit has a second common source node shared by a plurality of transistors. The first common source node and the second common source node are alternately reset to a predetermined voltage in each clock cycle.

In the differential switch circuit, voltages of the first and second common source nodes are reset to a predetermined voltage before turning the switch on in each clock cycle. This prevents fluctuations in voltage at the common source node caused by an output terminal voltage from affecting an output current.

According to a second aspect of the present invention, in the differential switch circuit of the first aspect of the present invention, the first common source node is coupled to a drain node of a first transistor, the second common source node is coupled to a drain node of a second transistor, and a source node of the first transistor and a source node of the second common source nodes are coupled to each other to form a third common source node.

In the differential switch circuit, voltages of the first and second common source nodes are reset to a predetermined voltage, i.e., a voltage at the third common source node, before turning the switch on in each clock cycle. This prevents fluctuations in voltage at the common source node caused by an output terminal voltage from affecting an output current.

According to a third aspect of the present invention, in the differential switch circuit of the second aspect of the present invention, the third common source node is coupled to an output of a current source.

In the differential switch circuit, voltages of the first and second common source nodes are reset to a predetermined voltage, i.e., a voltage at the third common source node, before turning the switch on in each clock cycle. This prevents fluctuations in voltage at the common source node caused by an output terminal voltage from affecting an output current.

According to a fourth aspect of the present invention, in the differential switch circuit of the third aspect of the present invention, the current source includes a current source transistor, and a cascode transistor which is cascode-coupled to a drain node of the current source transistor. The third common source node is coupled to a drain terminal of the cascode transistor.

The differential switch circuits is also advantageous in bringing a reset voltage (i.e., a voltage at the third common source node) closer to voltages of the first and second common source nodes at the time when the differential switch is in an ON state.

According to a fifth aspect of the present invention, in the differential switch circuit of the first aspect of the present invention, the first common source node and the second common source node are alternately coupled to a current source for reset.

In the differential switch circuit, voltages of the first and second common source nodes are reset to a predetermined voltage, before turning the switch on in each clock cycle. This prevents fluctuations in voltage at the common source node caused by an output terminal voltage from affecting an output current.

According to a sixth aspect of the present invention, in the differential switch circuit of the fifth aspect of the present invention, the first common source node is coupled to a drain terminal of a first transistor, the second common source node is coupled to a drain terminal of a second transistor, and a source node of the first transistor and a source node of the second transistor are coupled to each other to form a third common source node.

In the differential switch circuit, voltages of the first and second common source nodes are reset to a predetermined voltage before turning the switch on in each clock cycle. This prevents fluctuations in voltage at the common source node caused by an output terminal voltage from affecting an output current.

According to a seventh aspect of the present invention, in the differential switch circuit of the sixth aspect of the present invention, the third common source node is coupled to an output of a current source.

In the differential switch circuit, voltages of the first and second common source nodes are reset to a predetermined voltage before turning the switch on in each clock cycle. This prevents fluctuations in voltage at the common source node caused by an output terminal voltage from affecting an output current.

According to an eighth aspect, the present invention provides a D/A converter including multiple ones of the differential switch circuit of the second aspect of the present invention. With this structure, a D/A converter for communications having improved distortion characteristics can be achieved.

According to a ninth aspect, the present invention provides a D/A converter including multiple ones of the differential switch circuit of the fifth aspect of the present invention. With this structure, a D/A converter for communications having improved distortion characteristics can be achieved.

According to a tenth aspect, the present invention provides a semiconductor integrated circuit including the D/A converter of the eighth or ninth aspect of the present invention mounted thereon. With this structure, a semiconductor integrated circuit having excellent communication characteristics can be achieved.

According to an eleventh aspect, the present invention provides a communication apparatus including the semiconductor integrated circuit of the tenth aspect of the present invention mounted thereon. With this structure, a communication apparatus having excellent communication characteristics can be achieved.

Effects of the Invention

The present invention prevents fluctuations in voltage at a common source node in a differential switch circuit. The use of the differential switch circuit improves distortion characteristics of a D/A converter for communications having a high speed conversion frequency.

BRIEF DESCRIPTION OF DRAWINGS

FIG. 3 is a logic table illustrating operation of the current switch shown in FIG. 2.

FIG. 6 is a logic table illustrating operation of the current switch shown in FIG. 5.

DESCRIPTION OF CHARACTERS

Figure 1:
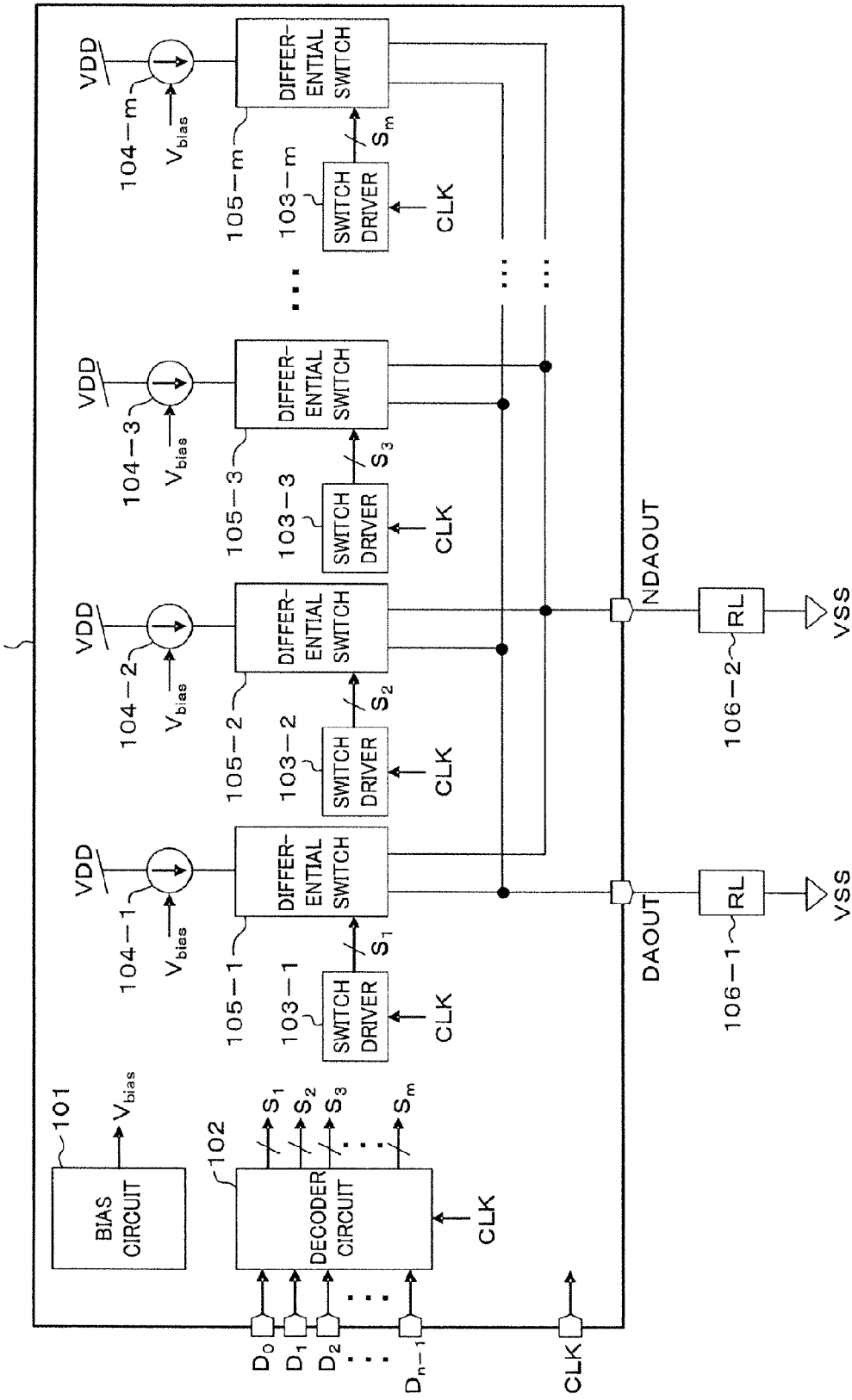
FIG. 1 is a block diagram illustrating the structure of a D/A converter according to the first embodiment.

100 D/A converter
101 bias circuit
102 decoder circuit
103-1 through 103-m switch driver circuits
104-1 through 104-m, 11, 21 current sources
105-1 through 105-m differential switch circuits
TP101 current source transistor
TP111, TP112, TP102 cascode transistors
1, 2 differential switch basic circuits
TP121, TP122, TP123, TP131, TP132, TP133 P-channel transistors

BEST MODE FOR CARRYING OUT THE INVENTION

Hereinafter, embodiments of the present invention will be specifically described with reference to the drawings. The D/A converter described in the embodiments below is useful for a semiconductor integrated circuit used for a transmitter of a wireless LAN, a mobile phone, a cable modem, millimeter-wave technology, a wireless HD and the like, as well as a communication apparatus including the transmitter. Note that, in the descriptions of the embodiments, components having functions similar to those previously described are denoted by the same reference characters, and the descriptions thereof will be omitted.

Embodiment 1

(Structure of D/A Converter 100)

FIG. 1 is a block diagram illustrating a D/A converter 100 according to the first embodiment. The D/A converter 100 outputs analog output current signals, which are converted from n-bit digital signals $D_0$ through $D_{n-1}$ input from the outside to analog signals, from an analog non-inverting output terminal DAOUT. The D/A converter 100 outputs inverted signals of the analog output current signals from an analog inverting output terminal NDAOUT. Load resistors (RL) 106-1 and 106-2 are coupled to the analog non-inverting output terminal DAOUT and the analog inverting output terminal NDAOUT, respectively. Analog output current signals output from the output terminals DAOUT and NDAOUT are converted into voltages by the load resistors 106-1 and 106-2 for current-voltage conversion. As a result, analog output voltages according to the input digital signals $D_0$ through $D_{n-1}$ can be obtained.

The D/A converter 100 includes a bias circuit 101, a decoder circuit 102, a plurality (a number m) of switch driver circuits 103-1 through 103-m, a plurality (a number m) of current sources 104-1 through 104-m, and a plurality (a number m) of differential switch circuits 105-1 through 105-m.

The bias circuit 101 outputs a bias voltage $V_{bias}$. The bias voltage $V_{bias}$, which is output from the bias circuit 101, includes one or more bias voltages.

The decoder circuit 102 synchronizes input n-bit digital data $D_0$ through $D_{n-1}$ with a system clock CLK or a divided clock of the system clock CLK, and decode the signals to output digital signals $S_1$-$S_m$.

The switch driver circuits 103-1 through 103-m are provided to the corresponding differential switch circuits 105-1 through 105-m. Each switch driver circuit 103-i (where i ranges from 1 to m) synchronizes a digital signal $S_i$ (where i ranges from 1 to m) from the decoder circuit with the system clock CLK to supply the signals to the corresponding differential switch circuit 105-i (where i ranges from 1 to m).

The current sources 104-1 through 104-m are provided to the corresponding differential switch circuits 105-1 through 105-m. Each current source 104-i (where i ranges from 1 to m) outputs a current determined by a bias voltage $V_{bias}$ from the bias circuit 101. A current, which is output from each current source 104-i (where i ranges from 1 to m), is supplied to the corresponding differential switch circuit 105-i (where i ranges from 1 to m).

Each differential switch circuit 105-i (where i ranges from 1 to m) controls switching to selectively allow a current from the corresponding current source 104-i (where i ranges from 1 to m) to flow to the analog non-inverting output terminal DAOUT or to the analog inverting output terminal NDAOUT, according to a digital signal $S_i$ (where i ranges from 1 to m) from the corresponding switch driver circuit 103-i (where i ranges from 1 to m). Output currents from the analog non-inverting output terminal DAOUT of the differential switch circuit 105-i (where i ranges from 1 to m) are summed at the analog non-inverting output terminal DAOUT before being output, and output currents from the analog inverting output terminal NDAOUT are summed at the analog inverting output terminal NDAOUT before being output.

(Structure of Current Switch)

In the D/A converter 100 of FIG. 1, an output of each current source 104-i (where i ranges from 1 to m) is coupled to an input of the corresponding differential switch circuit 105-i (where i ranges from 1 to m) to form a current switch.

Figure 2:
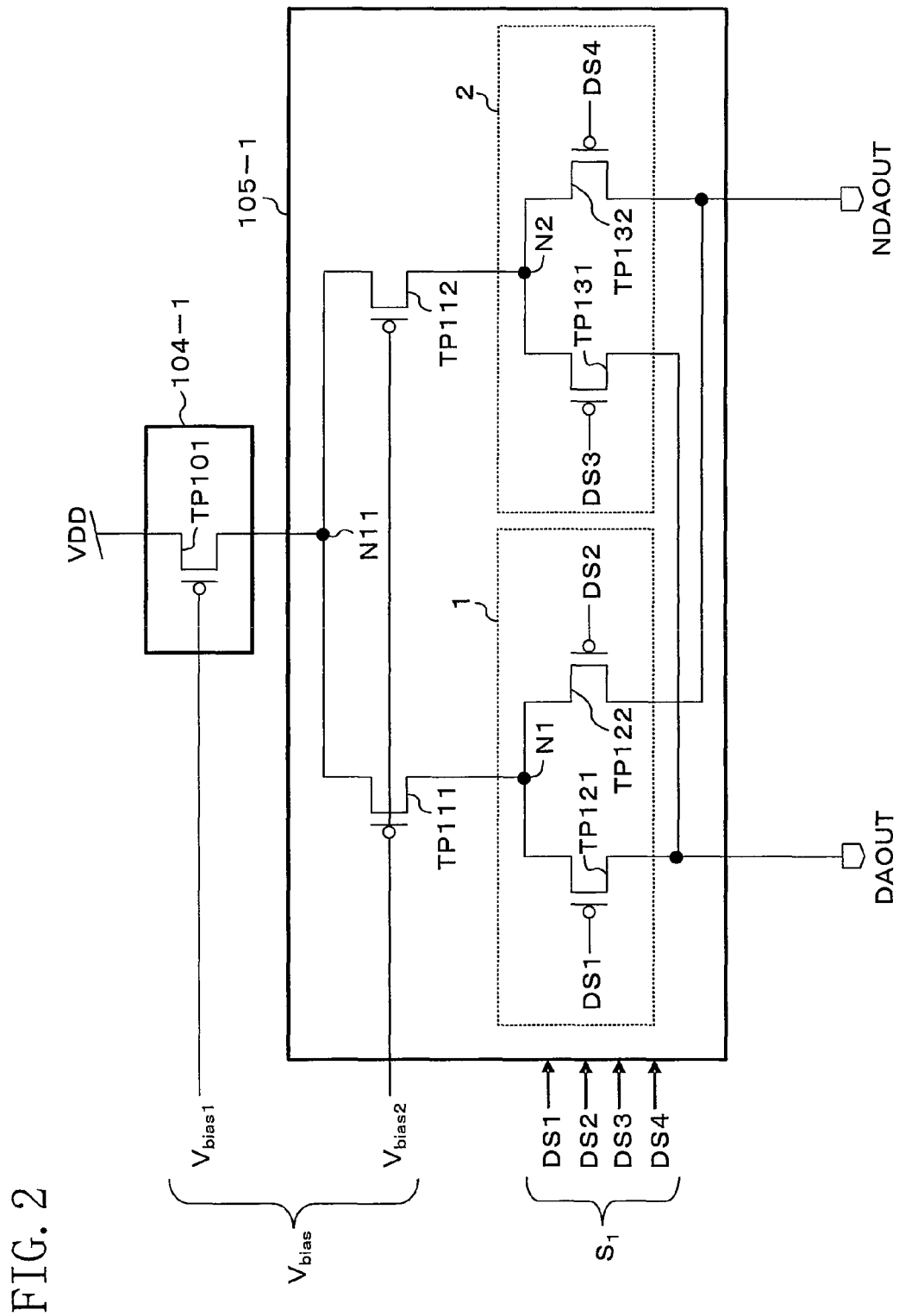
FIG. 2 is a circuit diagram of a current switch including a current source and a differential switch circuit.

FIG. 2 is a circuit diagram of a current switch including a current source 104-1 and a differential switch circuit 105-1. Note that FIG. 2 also represents the circuit diagram of each current switch including a current source 104-i (where i ranges from 2 to m) and a differential switch circuit 105-i (where i ranges from 2 to m).

In the current switch of FIG. 2, the current source 104-1 includes a current source transistor TP101. The differential switch circuit 105-1 includes cascode transistors TP111 and TP112, and differential switch basic circuits 1 and 2. A bias voltage $V_{bias}$, which is output from the bias circuit 101 of FIG. 1, includes bias voltages $V_{bias1}$ and $V_{bias2}$. Each digital signal $S_i$ (where i ranges from 1 to m), which is output from the decoder circuit 102, includes digital signals DS1-DS4.

The current source transistor TP101 includes a source terminal which is coupled to a power supply VDD, a gate terminal to which a bias voltage $V_{bias1}$ is applied, and a drain terminal to which source terminals of the cascode transistors TP111 and TP112 are commonly coupled. A bias voltage $V_{bias2}$ is commonly applied to gate terminals of the cascode transistors TP111 and TP112.

The differential switch basic circuit 1 includes P-channel transistors TP121 and TP122. A common source node N1 of the transistors is coupled to a drain terminal of the cascode transistor TP111. A digital signal DS1 is input to a gate of the P-channel transistor TP121, and a digital signal DS2 is input to a gate of the P-channel transistor TP122, thereby controlling ON/OFF states of the transistors.

Similarly, the differential switch basic circuit 2 includes P-channel transistors TP131 and TP132. A common source node N2 of the transistors is coupled to a drain terminal of the cascode transistor TP112. A digital signal DS3 is input to a gate of the P-channel transistor TP131, and a digital signal DS4 is input to a gate of the P-channel transistor TP132, thereby controlling ON/OFF states of the transistors.

Then, drain terminals of the P-channel transistors TP121 and TP131 are coupled to each other, and this commonly coupled node of the transistors is coupled to the non-inverting output terminal DAOUT of FIG. 1. Similarly, drain terminals of the P-channel transistors TP122 and TP132 are coupled to each other, and this commonly coupled node is coupled to the inverting output terminal NDAOUT of FIG. 1

(Operation and Advantages of Current Switch)

FIG. 3 is a logic table illustrating the current switch shown in FIG. 2. In actual operation, the switch alternates between one of states 1 and 2, and one of states 3 and 4 in each clock cycle of a system clock CLK. That is, only one of the four switch transistors TP121, TP122, TP131 and TP132 is ON at any time. In all clock cycles, two of the transistors are alternately change the states, one from ON to OFF and the other from OFF to ON so that a constant digital noise is obtained in each cycle. As such, a constant digital noise can be generated at each digital code which does not depend on an input digital code. The effect of noise on an analog output voltage does not degrade distortion characteristics, since each signal is synchronized with a frequency of the system clock CLK.

In such a case, when the current switch is in state 1 or state 2, the P-channel transistors TP131 and TP132 forming the differential switch basic circuit 2 are both OFF. Thus, the common source node N2 of the transistors is reset to a voltage at a node N11 to which the source terminals of the cascode transistors TP111 and TP112 are commonly coupled.

Similarly, when the current switch is in state 3 or state 4, the P-channel transistors TP121 and TP122 forming the differential switch basic circuit 1 are both OFF. Thus, the common source node N1 of the transistors is reset to a voltage at the node N11 to which the source terminals of the cascode transistors TP111 and TP112 are commonly coupled.

Since the node N11, to which the source terminals of the cascode transistors TP111 and TP112 are commonly coupled, is a source node of a cascode transistor, the voltage at the node N11 is stable and does not change, even when an output voltage changes.

Therefore, according to the first embodiment, voltages at the common source nodes N1 and N2 of the differential switch basic circuits 1 and 2 are reset to a predetermined voltage, i.e., a voltage at the source node N11 of the cascode transistor, before turning the switch on in each clock cycle. This can prevent fluctuations in voltage at the common source node caused by an output terminal voltage from affecting an output current, and can improve distortion characteristics of a D/A converter 100.

Embodiment 2

Figure 4:
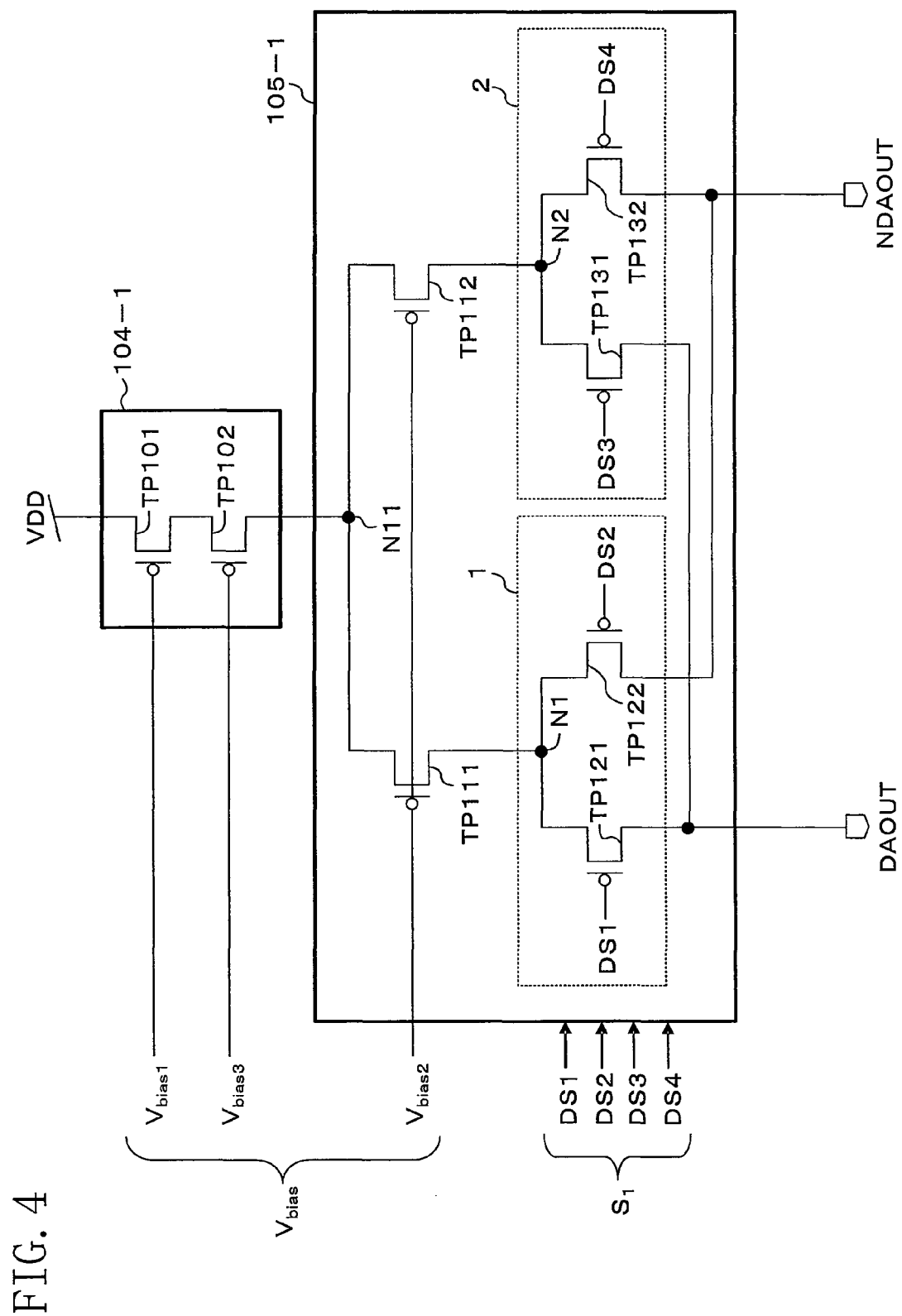
FIG. 4 is a circuit diagram illustrating a current switch according to the second embodiment.

A D/A converter 100 according to the second embodiment has a similar overall structure as shown in FIG. 1, but includes a current switch of FIG. 4 instead of the current switch of FIG. 2.

(Structure of Current Switch)

FIG. 4 is a circuit diagram illustrating a current switch including a current source 104-1 and a differential switch circuit 105-1. Note that FIG. 4 also represents the circuit diagram of each current switch including a current source 104-i (where i ranges from 2 to m) and a differential switch circuit 105-i (where i ranges from 2 to m).

In the current switch of FIG. 4, the current source 104-1 includes a current source transistor TP101 and a cascode transistor TP102. The differential switch circuit 105-1 includes cascode transistors TP111 and TP112, and differential switch basic circuits 1 and 2. A bias voltage $V_{bias}$, which is output from the bias circuit 101 of FIG. 1, includes bias voltages $V_{bias1}$, $V_{bias2}$, and $V_{bias3}$. Each digital signal $S_i$ (where i ranges from 1 to m), which is output from the decoder circuit 102, includes digital signals DS1-DS4.

The current source transistor TP101 includes a source terminal which is coupled to a power supply VDD, a gate terminal to which a bias voltage $V_{bias1}$ is applied, and a drain terminal to which a source terminal of the cascode transistor TP102 is coupled. A bias voltage $V_{bias3}$ is applied to a gate terminal of the cascode transistor TP102. Source terminals of the cascode transistors TP111 and TP112 are commonly coupled to a drain terminal of the cascode transistor TP102. A bias voltage $V_{bias2}$ is commonly applied to gate terminals of the cascode transistors TP111 and TP112.

The internal structures of the differential switch basic circuits 1 and 2 are similar to those shown in FIG. 2.

(Operation and Advantages of Current Switch)

Operation of the current switch of FIG. 4 is the same as shown in the logic table of FIG. 3. Thus, in the second embodiment, similar to the first embodiment, voltages at the common source nodes N1 and N2 of the differential switch basic circuits 1 and 2 are reset to a predetermined voltage, i.e., a voltage at a source node N11 of the cascode transistor, before turning the switch on in each clock cycle. This can prevent fluctuations in voltage at the common source node caused by an output terminal voltage from affecting an output current, and can improve distortion characteristics of a D/A converter 100.

Compared to the first embodiment, the second embodiment is advantageous in bringing a reset voltage (i.e., a voltage of the node N11) close to the voltages of the common source nodes N1 and N2 when the differential switch is ON.

Embodiment 3

Figure 5:
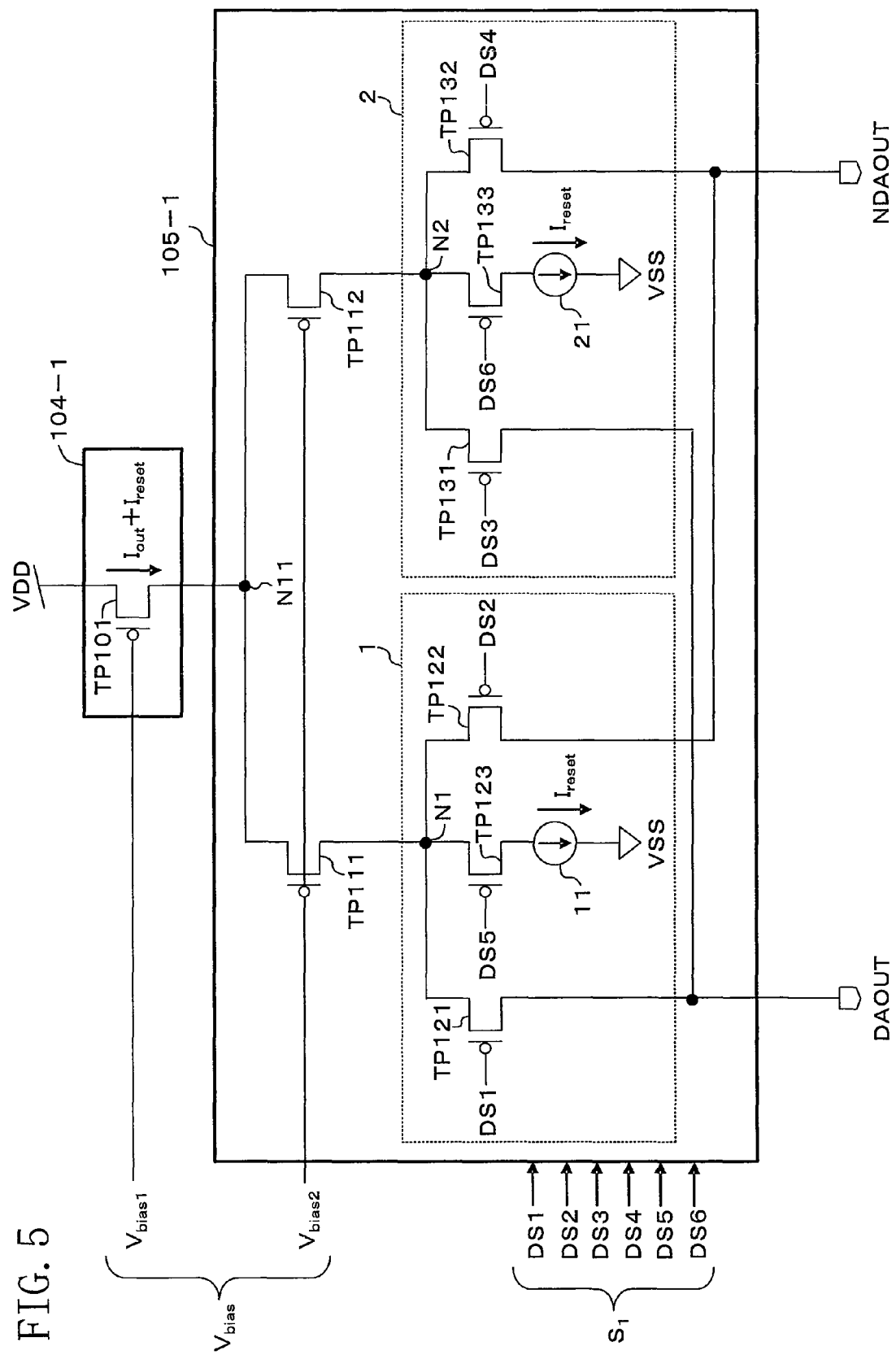
FIG. 5 is a circuit diagram illustrating a current switch according to the third embodiment.

A D/A converter according to the third embodiment has a similar overall structure as shown in FIG. 1, but includes a current switch of FIG. 5 instead of the current switch of FIG. 2.

(Structure of Current Switch)

FIG. 5 is a circuit diagram illustrating a current switch including a current source 104-1 and a differential switch circuit 105-1. Note that FIG. 5 also represents the circuit diagram of each current switch including a current source 104-i (where i ranges from 2 to m) and a differential switch circuit 105-i (where i ranges from 2 to m).

In the current switch of FIG. 5, the current source 104-1 includes a current source transistor TP101. The differential switch circuit 105-1 includes cascode transistors TP111 and TP112, and differential switch basic circuits 1 and 2. A bias voltage $V_{bias}$, which is output from the bias circuit 101 of FIG. 1, includes bias voltages $V_{bias1}$ and $V_{bias2}$. Each digital signal $S_i$ (where i ranges from 1 to m), which is output from the decoder circuit 102, includes digital signals DS1-DS6.

The current source transistor TP101 includes a source terminal which is coupled to a power supply VDD, a gate terminal to which a bias voltage $V_{bias1}$ is applied, and a drain terminal to which source terminals of the transistors TP111 and TP112 are commonly coupled. A bias voltage $V_{bias2}$ is commonly applied to gate terminals of the cascode transistors TP111 and TP112.

The differential switch basic circuit 1 includes P-channel transistors TP121, TP122 and TP123, and a current source 11. A common source node N1 of the P-channel transistors TP121, TP122 and TP123 is coupled to a drain terminal of the cascode transistor TP111. The digital signal DS1 is input to a gate of the P-channel transistor TP121, the digital signal DS2 is input to a gate of the P-channel transistor TP122, and the digital signal DS5 is input to a gate of the P-channel transistor TP123 to control ON/OFF states of the transistors.

Similarly, the differential switch basic circuit 2 includes P-channel transistors TP131, TP132 and TP133, and a current source 21. A common source node N2 of the P-channel transistors TP131, TP132 and TP133 is coupled to a drain terminal of the cascode transistor TP112. The digital signal DS3 is input to a gate of the P-channel transistor TP131, the digital signal DS4 is input to a gate of the P-channel transistor TP132, and the digital signal DS6 is input to a gate of the P-channel transistor TP133 to control ON/OFF states of the transistors.

Then, drain terminals of the P-channel transistors TP121 and TP131 are coupled to each other, and this commonly coupled node of the transistors is coupled to the non-inverting output terminal DAOUT of FIG. 1. Similarly, drain terminals of the P-channel transistors TP122 and TP132 are coupled to each other, and this commonly coupled node is coupled to the inverting output terminal NDAOUT of FIG. 1.

The P-channel transistors TP123 and TP133 are switch transistors for reset. A drain terminal of the P-channel transistor TP123 is coupled to the current source 11. A drain terminal of the P-channel transistor TP133 is coupled to the current source 21. The current sources 11 and 21 are typically formed of N channel transistors.

In the current switch of the present invention, a current "$I_{out}+I_{reset}$" flows to the current source transistor TP101, a current "$I_{reset}$" flows to the current source 11 or 21, and a current "$I_{out}$" flows to the output terminal.

(Operation and Advantages of Current Switch)

FIG. 6 is a logic table illustrating operation of the current switch shown in FIG. 5. In actual operation, the switch alternates between one of states 1 and 2, and one of states 3 and 4, in each clock cycle of a system clock CLK. That is, two of the six switch transistors TP121, TP122, TP123, TP131, TP132 and TP133 are ON at any time. In all clock cycles, two of the transistors are alternately change the states, one from ON to OFF and the other from OFF to ON so that a constant digital noise is obtained in each cycle. As such, a constant digital noise can be generated at each digital code which does not depend on an input digital code. The effect of noise on an analog output voltage does not degrade distortion characteristics, since each signal is synchronized with a clock frequency of the system clock CLK.

In such a case, when the current switch is in state 1 or state 2, the P-channel transistors TP131 and TP132 forming the differential switch basic circuit 2 are both OFF, and the P-channel transistor TP133 is ON. Thus, the common source node N2 of the transistors is reset to a predetermined voltage determined by a current $I_{reset}$ of the current source 21 flowing into the P-channel transistor TP133.

Similarly, when the current switch is in state 3 or state 4, the P-channel transistors TP121 and TP122 forming the differential switch basic circuit 1 are both OFF, and the P-channel transistor TP123 is ON. Thus, the common source node N1 of the transistors is reset to a voltage determined by a current $I_{reset}$ of the current source 11 flowing into the P-channel transistor TP123.

In the third embodiment, a simulation was performed at a clock frequency $F_{clk}$ of 1 GHz, and a DAC output frequency $F_{sig}$ of 303.7 MHz. The result indicated that the aliasing component (image) due to the third harmonic with respect to a main signal was 62 dBc. Compared to a simulation using a similar circuit as in Non-Patent Document 1, the simulation using the present embodiment achieved an improvement in the aliasing component by approximately 7 dB.

Therefore, according to the third embodiment, voltages of the common source nodes N1 and N2 of the differential switch basic circuits 1 and 2 are reset to a predetermined voltage, i.e., a voltage determined by the currents $I_{reset}$ flowing to the reset transistors TP123 and TP133, before the switch conducts a current to the output terminal DAOUT or NDAOUT in each clock cycle. This can prevent fluctuations in voltage at the common source node caused by an output terminal voltage from affecting an output current, and can improve distortion characteristics of a D/A converter 100.

Embodiment 4

Figure 7:
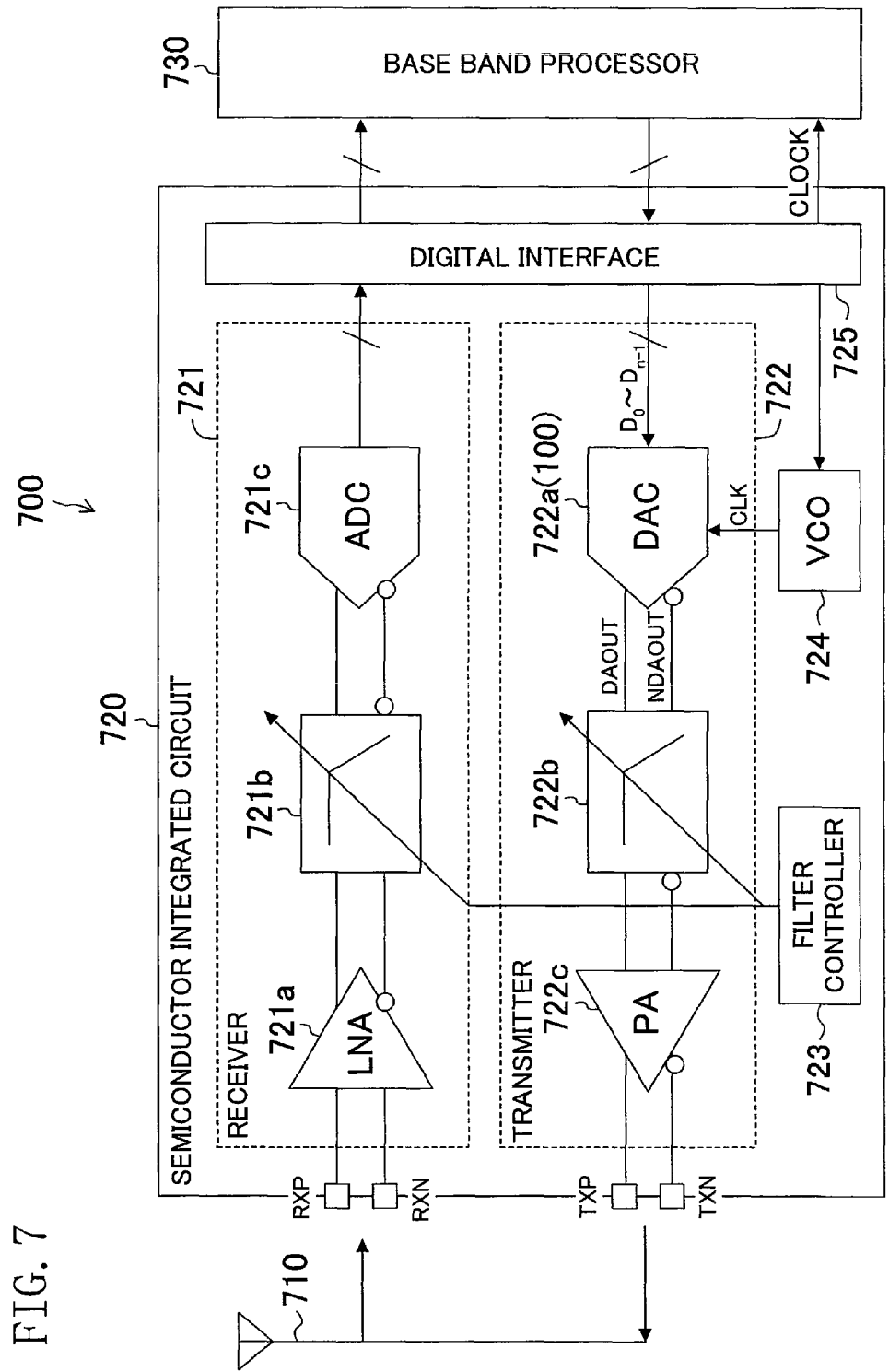
FIG. 7 is a block diagram illustrating the structure of a communication apparatus according to the fourth embodiment.
Figure 8:
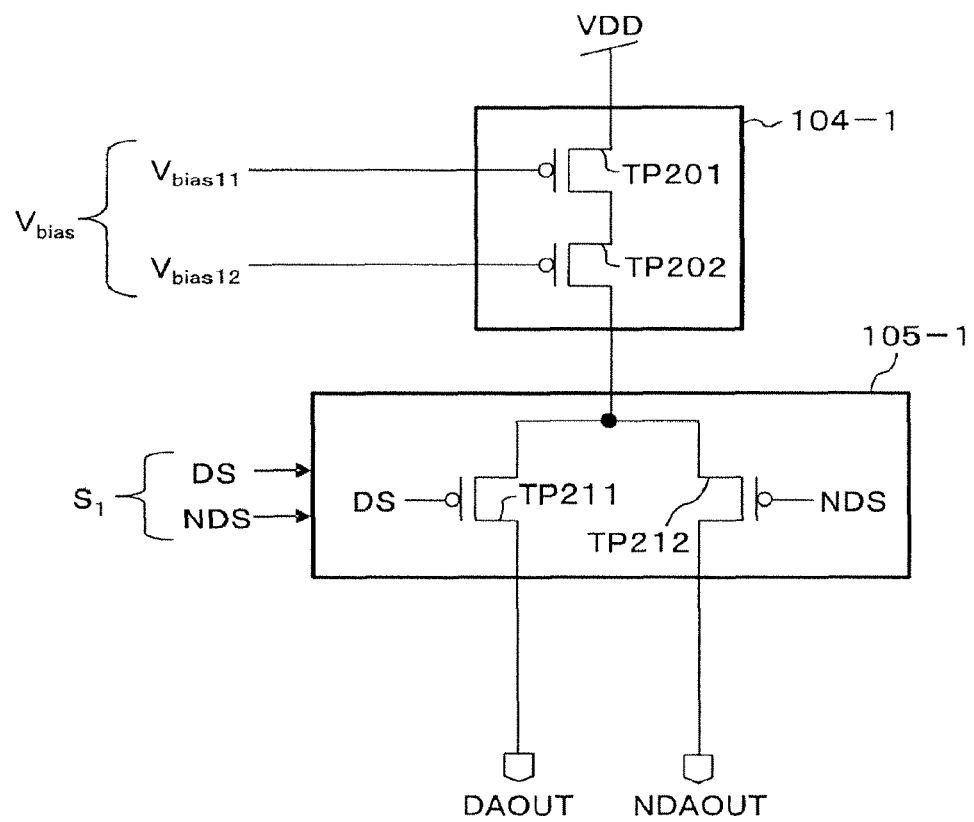
FIG. 8 is a circuit diagram illustrating the structure of a conventional current switch.
Figure 9:
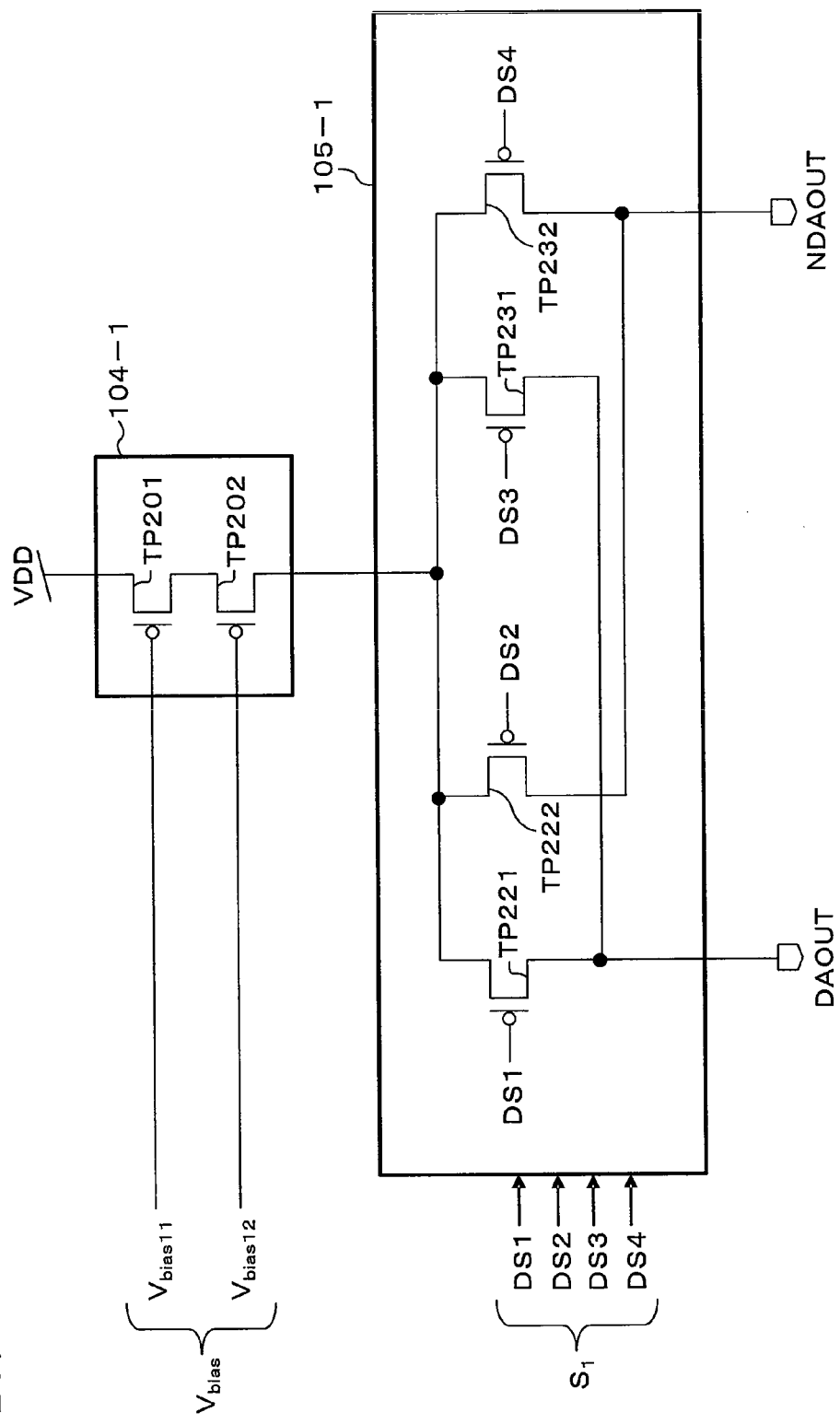
FIG. 9 is a circuit diagram illustrating the structure of a conventional current switch.

FIG. 7 is a block diagram illustrating the structure of a communication apparatus 700 according to the fourth embodiment. The communication apparatus 700 is implemented as a mobile phone, for example.

As shown in FIG. 7, the communication apparatus 700 includes an antenna 710, a semiconductor integrated circuit 720, and a base band processor 730. The semiconductor integrated circuit 720 is a semiconductor integrated circuit utilizing the D/A converter of the present invention, and is used primarily for transmitting and receiving signals. The structure of the semiconductor integrated circuit 720 is described below. The base band processor 730 processes received signals and signals to be transmitted.

(Structure of Semiconductor Integrated Circuit 720)

The semiconductor integrated circuit 720 includes a receiver 721, a transmitter 722, a filter controller 723, a voltage controlled oscillator (VCO) 724, and a digital interface 725.

The receiver 721 converts signals received at the antenna 710 into digital signals and output the converted signals. The receiver 721 includes a low noise amplifier (LNA) 721a, a filter 721b, and an A/D converter (ADC) 721c for reception. The low noise amplifier 721a amplifies signals received at the antenna 710. The filter 721b is a filter capable of tuning the frequency characteristics. The filter controller 723 controls the frequency characteristics. The A/D converter 721c for reception converts outputs of the filter 721b into digital signals, and output the signals.

The transmitter 722 converts input digital signals into analog signals, and transmits the signals from the antenna 710. The transmitter 722 includes a D/A converter (DAC) 722a for transmitting signals, a filter 722b, and a power amplifier (PA) 722c. The D/A converter 722a for transmission is the D/A converter of the present invention. For example, the D/A converters 100 of the first through third embodiments may be applicable to the D/A converter 722a. The D/A converter 722a (100) for transmission converts digital signals input from a digital interface 725 into analog signals, and output the signals to the filter 722b. The filter 722b is a filter capable of tuning the frequency characteristics, and the filter controller 723 controls the frequency characteristics. The power amplifier 722c amplifies outputs of the filter 722b, and transmits the outputs through the antenna 710.

As described above, the filter controller 723 controls the frequency characteristics of the filters 721b and 722b. The voltage controlled oscillator 724 generates a system clock CLK used for, for example, the D/A converter 722a (100) for transmission. The digital interface 725 mediates data transfer (transfer of digital signals) between the receiver 721 and the base band processor 730, and between the transmitter 722 and the base band processor 730. The digital interface 725 also controls the oscillation frequency of the voltage controlled oscillator 724 and outputs clock signals to the base band processor 730.

(Operation of Communication Apparatus 700)

In the communication apparatus 700, when receiving signals, signals received at the antenna 710 are input to the receiver 721 of the semiconductor integrated circuit 720; pass through the low noise amplifier (LNA) 721a, the frequency-tuned filter 721b, and the A/D converter 721c for reception; and are converted into digital signals. Then, the signals are transmitted to the base band processor 730 through the digital interface 725 in order to be processed.

When transmitting signals, digital signals processed by the base band processor 730 are transmitted to the semiconductor integrated circuit 720, and then input to the transmitter 722 through the digital interface 725. In the transmitter 722, the digital signals are converted into analog signals at the D/A converter 722a (100) for transmission, and then transmitted from the antenna 710 through the filter 722b and the power amplifier 722c.

As described above, in this embodiment, the D/A converter of the present invention is used for the semiconductor integrated circuit 720, thereby achieving a low-cost, high-performance semiconductor integrated circuit. That is, it is possible to improve performance of the communication apparatus 700, and to design a communication system at low cost.

INDUSTRIAL APPLICABILITY

The presently disclosed D/A converter is advantageous in preventing a voltage at a common source node of a differential switch from depending on a voltage of an output terminal, while achieving uniformity of digital noise so as not to depend on an input digital code. Therefore, the present invention is useful as a D/A converter (DAC) for converting a digital signal into an analog signal, a semiconductor integrated circuit, a communication apparatus, and the like.

The invention claimed is:

1. A differential switch circuit comprising:
a first differential switch basic circuit; and
a second differential switch basic circuit coupled in parallel,
where the first differential switch basic circuit includes a first common source node shared by a plurality of transistors, and the second differential switch basic circuit includes a second common source node shared by a plurality of transistors,
wherein
the first common source node and the second common source node are alternately reset to a predetermined voltage in each clock cycle,
the first common source node is coupled to a drain node of a first transistor,
the second common source node is coupled to a drain node of a second transistor,
a source node of the first transistor and a source node of the second transistor are coupled to each other to form a third common source node,
the third common source node is coupled to an output of a current source,
the current source includes a current source transistor, and a cascode transistor which is cascode-coupled to a drain node of the current source transistor, and
the third common source node is coupled to a drain terminal of the cascode transistor.

2. A differential switch circuit comprising:
a first differential switch basic circuit; and
a second differential switch basic circuit coupled in parallel,
where the first differential switch basic circuit includes a first common source node shared by a plurality of transistors, and the second differential switch basic circuit includes a second common source node shared by a plurality of transistors,
wherein
the first common source node and the second common source node are alternately reset to a predetermined voltage in each clock cycle,
when the second differential switch basic circuit is turned on, the first common source node is coupled to a first current source for reset, and
when the first differential switch basic circuit is turned on, the second common source node is coupled to a second current source for reset.

3. The differential switch circuit of claim 2, wherein
the first common source node is coupled to a drain node of a first transistor,
the second common source node is coupled to a drain node of a second transistor, and
a source node of the first transistor and a source node of the second transistor are coupled to each other to form a third common source node.

4. The differential switch circuit of claim 3, wherein the third common source node is coupled to an output of a current source.

5. A D/A converter comprising multiple ones of the differential switch circuit of claim 2.

6. A semiconductor integrated circuit comprising the D/A converter of claim 5 mounted thereon.

7. A communication apparatus comprising the semiconductor integrated circuit of claim 6 mounted thereon.

* * * * *